United States Patent
Moehrle

(10) Patent No.: US 10,680,409 B2
(45) Date of Patent: Jun. 9, 2020

(54) LASER DEVICE

(71) Applicant: Fraunhofer-Gesellschaft zur Foerderung der angewandten Forschung e.V., Munich (DE)

(72) Inventor: Martin Moehrle, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/914,864

(22) Filed: Mar. 7, 2018

(65) Prior Publication Data

US 2019/0280462 A1 Sep. 12, 2019

(51) Int. Cl.
*H01S 5/12* (2006.01)
*H01S 5/028* (2006.01)
*H01S 5/10* (2006.01)
*H01S 5/00* (2006.01)

(52) U.S. Cl.
CPC ............ *H01S 5/124* (2013.01); *H01S 5/0287* (2013.01); *H01S 5/1039* (2013.01); *H01S 5/1053* (2013.01); *H01S 5/1212* (2013.01); *H01S 5/1215* (2013.01); *H01S 5/0035* (2013.01); *H01S 5/1246* (2013.01)

(58) Field of Classification Search
CPC ...... H01S 5/124; H01S 5/1039; H01S 5/1212; H01S 5/1215; H01S 5/0287; H01S 5/1053; H01S 5/1246; H01S 5/0035
See application file for complete search history.

(56) References Cited

U.S. PATENT DOCUMENTS

| | | | |
|---|---|---|---|
| 4,794,618 A | 12/1988 | Mito | |
| 4,796,273 A | 1/1989 | Yamaguchi | |
| 5,185,759 A | 2/1993 | Matsuyama | |
| 5,272,714 A | 12/1993 | Chen et al. | |
| 5,642,371 A * | 6/1997 | Tohyama | B82Y 20/00 372/20 |
| 6,088,374 A * | 7/2000 | Sato | H01S 5/4031 372/23 |
| 6,826,203 B1 | 11/2004 | Granestrand | |
| 9,372,306 B1 * | 6/2016 | Nagarajan | G02B 6/12004 |
| 2003/0081878 A1 * | 5/2003 | Joyner | G02B 6/12019 385/14 |

(Continued)

OTHER PUBLICATIONS

Carroll, John E. et al., "Distributed Feedback Semiconductor Lasers", J. Carroll, J. Whiteaway, D. Plumb, "Distributed Feedback Semiconductor Lasers", publisher: The Institutions of Electrical Engineers 1998, London, p. 145ff, 1998, 145ff.

(Continued)

*Primary Examiner* — Xinning (Tom) Niu
(74) *Attorney, Agent, or Firm* — Perkins Coie LLP; Michael A. Glenn

(57) ABSTRACT

A Distributed Feedback Laser comprises a layer stack comprising a p-layer, an n-layer which are arranged so as to form an pn-junction having an active layer in between. Within the layer stack, an index coupled grating layer or a grating layer is arranged which comprises a first, a second, and a third grating portion. The first, the second, and the third grating portions are asymmetrically arranged along a lateral dimension of the layer stack, wherein the second grating portion is formed without a grating structure.

22 Claims, 4 Drawing Sheets

(56) References Cited

U.S. PATENT DOCUMENTS

| | | | |
|---|---|---|---|
| 2009/0202196 A1* | 8/2009 | Kish, Jr. | B82Y 20/00 |
| | | | 385/14 |
| 2013/0128911 A1* | 5/2013 | Brox | H01S 5/1231 |
| | | | 372/50.11 |
| 2014/0211823 A1 | 7/2014 | Nakahara et al. | |
| 2015/0071589 A1 | 3/2015 | Nakamura et al. | |
| 2016/0277117 A1 | 9/2016 | Zheng et al. | |

OTHER PUBLICATIONS

Okai, M. et al., "Corrugation-Pitch-Modulated Phase-shifted DFB Laser", M. Okai, N. Chinone, H. Taira, T. Harada, "Corrugation-Pitch-Modulated Phase-shifted DFB Laser", IEEE Photon. Techn. Letters, vol. 1, No. 8, 1989, pp. 200, 200, 1989.

Srinivasan, Sudharsana et al., "Design of phase15 shifted hybrid silicon distributed feedback lasers", S. Srinivasan, A. W. Fang, D. Liang, J. Peters, B. Kaye, J. E. Bowers, ,,Design of phase15 shifted hybrid silicon distributed feedback lasers, Optics Express 9255, vol. 19, No. 10, 2011, May 9, 2011.

Venghaus, Herbert et al., "Fibre Optic Communication", H. Venghaus, N. Grote, "Fibre Optic Communication", 2nd Edition Springer Verlag Heidelberg 2017, p. 151ff, 2017, 151ff.

Zhang, Chong et al., "Low threshold and high speed short cavity distributed feedback hybrid silicon lasers", C. Zhang; S. Srinivasan, Y. Tang, M. J. R. Heck, M. L. Davenport, J. E. Bowers, "Low threshold and high speed short cavity distributed feedback hybrid silicon lasers", Optics Express 10202, vol. 22, No. 9, 2014, May 4, 2014.

\* cited by examiner

LASER DEVICE

Embodiments of the present invention refer to a Laser Device and to a Distributed Feedback Laser (DFB laser) device.

High speed DFB lasers in a wavelength range between 1200 nm and 1700 nm are of particular interest for high bit rate data transmission via glass fiber.

For obtaining high modulation bandwidth, e.g. >20 GHz, such DFB lasers often have a resonator length <=200 μm and a high grating coupling factor [cf. 1.1].

Normally, InGaAlAs-MQW-layers as active layer and index-coupled DFB gratings are used for such high speed lasers in the above stated wavelength range, where single-mode operation can be obtained by incorporating a $\lambda/4$ phase jump (=local shift of the two grating areas by half a grating period $\Lambda$ because of the Bragg condition $\lambda=2*n_{eff}*\Lambda$, wherein $n_{eff}$ is the effective refractive index of the laser structure) [1.2, 1.3, 1.4].

However, due to the high photon densities obtained within these short lasers, a so-called spatial hole burning effect occurs at the location of the incorporated phase jump [1.5]. This results locally in a reduction of the optical gain and hence in a reduction of the obtainable modulation bandwidth.

Mainly 4 different methods for preventing this spatial hole burning have been suggested so far:
a) Usage of two $\lambda/8$ phase jumps instead of one $\lambda/4$ phase jump [1.5].
b) Usage of corrugation pitch modulated phase shifts in DFB lasers [1.6, 1.7]. Here, a $\lambda/4$ phase jump is replaced by a grating area having a slightly larger grating period than in the residual area of the DBF laser, such that a $\lambda/4$ phase jump distributed exactly across this area results. This variation is already known [1.7] and can therefore not be used.
(c) Usage of a distributed phase shift [1.8]. Here, by widening the laser strip in an area of the laser, effectively a $\lambda/4$ phase jump is obtained. However, with regard to technology, it is almost impossible to realize this variation with a good yield.
(d) Usage of a centrally arranged large phase shift area instead of a $\lambda/4$ phase jump with laser facets of a hybrid DFB laser that are effectively antireflective on both sides (active layer InP based, grating in silicon waveguide) [1.9, 1.10].

In all four cases, reduction of the spatial hole burning effect results. However, this spatial hole burning reduction effect is not achieved for all lasers, e.g. for lasers having an AR/HR coating.

Therefore, it is the technical objective to provide an approach for reducing the spatial hole burning effect for a wider range of applications.

This objective is solved by the subject matter of the independent claims.

An embodiment of the present invention provides a Distributed Feedback Laser device comprising a layer stack. The layer stack comprising a p-layer, n-layer which are arranged so as to form a pn-junction having an active area in between. Within a layer stack, an index coupled grating layer is arranged which comprises a first and a second, and a third grating portion. The first, the second, and the third grating portions are asymmetrically arranged along a lateral dimension of the layer stack, wherein the second grating portion is formed without a grating structure.

Embodiments of the present invention are based on the finding that an asymmetrical large phase shift (ASLPS) DFB laser enables a wider range of application, especially the applicability for AR/HR coated laser devices. Such a laser comprises at least two grating areas and a large phase area without grating in-between which is not arranged exactly in the center, but is arranged slightly offset, for example, in a direction of the rear face or the HR coated rear facet. This concept is beneficial, since it enables a good reduction of spatial hole burning effects and is applicable also to lasers which are anti-reflective coated on the front (AR) and/or reflective coated on the rear (HR).

According to embodiments, the first, the second, and the third grating portions are laterally arranged, such that the second grating, also referred to as phase shifting element, lies asymmetrically between the first and the third grating portion. The asymmetric arrangement may, for example, be achieved, when the first grating portion belonging the front side of the laser device, has a larger lateral extension, when compared to the lateral extension of the third grating portion belonging to the back side of the laser device. Regarding the front side and the back side, it should be noted that, according to preferred embodiments, the front side (vertical surface of the laser device) may comprise a coating, e.g. an AR coating configured to improve the coupling out, e.g. by anti-reflective properties. It should be noted that the front side typically extends perpendicular to the layers of the layer stack. According to embodiments, the back side of a laser device (back surface also extending substantially perpendicular to the layers of the layer stack) may comprise a reflective element, like an HR coating.

According to embodiments, the dimensions of the grating portions may be designed as following:

The second grating portion has a lateral extension defined by $L_{LPS}=(2*n_2+1)*(0.5\Lambda)$. Here, $\Lambda$ is the grating period and $n_2>=1$. This dimensioning enables to form multiple $\lambda/4$ shifts. According to embodiments, the longitudinal extension of the first grating portion is defined by $\Lambda_f=n_1*\Lambda$. Here, $n_1$ is the number of periods of the grating portion 1. Analogously, the third grating portion has a longitudinal extension defined by $L_r=n_3*\Lambda$, wherein $n_3$ is the number of periods for the third grating portion. Here, the $n_1$ and the $n_3$ are selected so that $L_r<L_f$. The three longitudinal extension $L_f+L_{LPS}+L_r$ define, according to an embodiment, the entire length.

According to another embodiment, the grating layer comprises five portions, wherein the lateral extension of the two portions without grating are defined by $L=(4*n_2+1)*(0.25*\Lambda)$, wherein $n_2$ is > or =1. This enables to form multiple $\lambda/8$ phase shifts.

According to another embodiment, the grating layer comprises (X/2+1) portions where X=12, 16, 20, 24 . . . with lateral extensions, wherein the lateral extensions of the (X/2+1) portions without grating are defined by $((X/2)*n_2+1)*((2/X)*\Lambda)$ having an $n_2>=1$. This enables to form multiple $\lambda/X$ phase shifts.

According to the structure, it should be noted that preferably, but not necessarily, the grating layer is an index coupled grating layer. However, same can according to further embodiments be a grating layer having complex coupled gratings. The grating layer is, according to embodiments, arranged within the p-waveguide layer formed within the p-layer or adjacent to, e.g. on top of the p-waveguide layer. According to another embodiment, the grating layer may be arranged within the n-waveguide layer (formed within the n-layer) or adjacent to the n-waveguide layer, e.g. underneath same. According to embodiments, the layer device is realized on a substrate comprising InP, or GaAs, or on a hybrid substrate comprising Si or SiNx.

According to further embodiments, the Distributed Feedback Laser device forms an external cavity laser. Regarding the application, it should be noted that the Distributed Feedback Laser device may monolithically be integrated with a photonic integrated circuit (PIC).

Preferred realizations are defined by the subject matter of the independent claims. Embodiments of the present invention will subsequently be discussed referring to the enclosed Figures, wherein FIG. 1 shows a schematic block diagram of a Distributed Feedback Laser device according to a basic embodiment;

FIG. 2 shows a schematic block diagram of a Distributed Feedback Laser device according to an enhanced embodiment; and FIGS. 3a to 3d show schematic diagrams of intensity distributions along the Distributed Feedback Laser of FIG. 2.

Before discussing the embodiments of the present invention in detail taking reference to the Figures, it should be noted that the same reference numbers are provided to objects having the same or similar function so that the description thereof is mutually applicable or interchangeable.

FIG. 1 shows DFB laser 10 comprising a layer arrangement 12. The layer arrangement comprises a p-layer 12p, an n-layer 12n as well as an active area 12a in between. Due to the p-layer 12p, the n-layer 12n, a pn-junction is formed within the active area 12a. The layer stack additionally comprises a grating layer 12g, e.g. an index coupled grating layer 12g.

The front side and the back side of the laser device 10 are the vertical surface perpendicular to the layer stack 12. The front side is marked by the reference numeral 10f, while the back side is marked by the reference numeral 10b. The length of the entire laser device 10 is marked by the reference numeral L.

Regarding the grating layer 12g, it should be noted that same is subdivided into three grating portions. The three grating portions are marked by the reference numerals 12g1, 12g2, and 12g3. The first grating portion 12g1 is arranged at or next to the front side 10f, while the third grating portion 12g3 is arranged at or next to the back side 10b. The second grating portion 12g2 lies between the two portions 12g1 and 12g3. Expressed in other words, this means that along the lateral extension L of the entire device 10, the grating 12g is subdivided into three lateral areas from the front 10f to the back 10b. Here, the second portion 12g2 surrounded by the other portions 12g1 and 12g3 lies asymmetrically along the lateral extension of the entire device 10. For example, the third grating portion 12g3 is made smaller than the first grating portion 12g1, such that second grating portion 12g2 is arranged closer to the back side 10b than to the front side 10f. Due to this, the asymmetrical arrangement can be achieved.

Regarding the second grating portion 12g2, it should be noted that same serves as phase shifter and does not comprise grating elements. Expressed in other words, this means that the grating elements of the grating layer 12g are just arranged within the first and the third grating portions 12g1 and 12g3. This design of the grating layer has the purpose to reduce the spatial hole burning effects, especially for AR/HR coated DFB lasers.

As can be seen, the grating layer 12g is arranged within the p-layer 12p or between the p-layer 12p and the active layer 12a. Alternatively, the grating layer 12g may be arranged within the n-layer 12n or between the n-layer 12n and the active layer 12a. According to further embodiments, a waveguide may be formed within the respective n- or p-layer 12p or 12n. In this case, the waveguide comprises or is adjacent to the grating layer 12p.

With respect to FIG. 2, another embodiment will be discussed. FIG. 2 shows a schematic cross-section of a DFB-laser 10' having an asymmetric large phase shift (ASLPS) along the entire length L. The device 10' comprises a layer stack 12'. Here, the layer stack comprises an active layer 12a' in the middle of the p-layer 12p' (here a p-InP-layer) and the n-layer 12n' (here an n-InP-layer). Expresses in other words, the layers 12p' and 12n' are arranged, such that the active layer 12a' lies in between.

Between the p-layer 12p' and active layer 12a', an optional p-waveguide 12pw' is arranged. Analogously, between the n-layer 12n' and the active layer 12a', an optional n-waveguide 12nw' is arranged. The grating layer 12g' is arranged between the waveguide 12pw' and the p-layer 12p', or, in more detail formed within the junction between the two layers. The layer stack 12' is completed by optional contacts, namely an n-contact 12nc' and a p-contact 12pn' which are arranged so as to contact the layers 12n' and 12p' from externally. Therefore, the two layers 12nc' and 12pc' enclose the further layers of the layer stack 12' (such that the layers 12p', 12g', 12pw', 12a', 12nw', and 12n') lie in between.

Regarding the grating layer 12g', it should be noted that same comprises out of two grating areas 12g1' and 12g3' having a larger phase area 12g2' in between. This area 12g2' is designed without grating and is not arranged exactly in the center, but arranged slightly offset in the direction of the rear phase 10b'.

The laser device 10' comprises a HR coated back surface 12b' and a AR coated front surface 12f'. It should be noted that instead of the HR facet coating, a DBR grating or another reflective element may be used. Additionally it should be noted that the front side 12f' or the back side 12b' may comprise etched facets or cleaved facets.

The phase area 12g2' without grating may correspond exactly to a multiple phase jump: this means, there is a phase jump by an odd multiple of $\lambda/4$ according to $(2n+1)*0.5\Lambda$ wherein $n>=1$, e.g. $n=20$.

By using an ASLPS DFB grating, the local intensity at the location of the phase jump can be reduced significantly and hence the spatial hole burning effect can be reduced. Below, taking reference to FIGS. 3a to 3d, simulated intensity course for different grating variations according to above discussed approach will be discussed. In all cases, the phase jump/phase jumps/phase jump areas are slightly offset in the direction of the HR coated rear facet. The excessive intensity increase can be clearly seen in the case of the single $\lambda/4$ phase jump which then results in spatial hole burning effects.

Figure 3A:
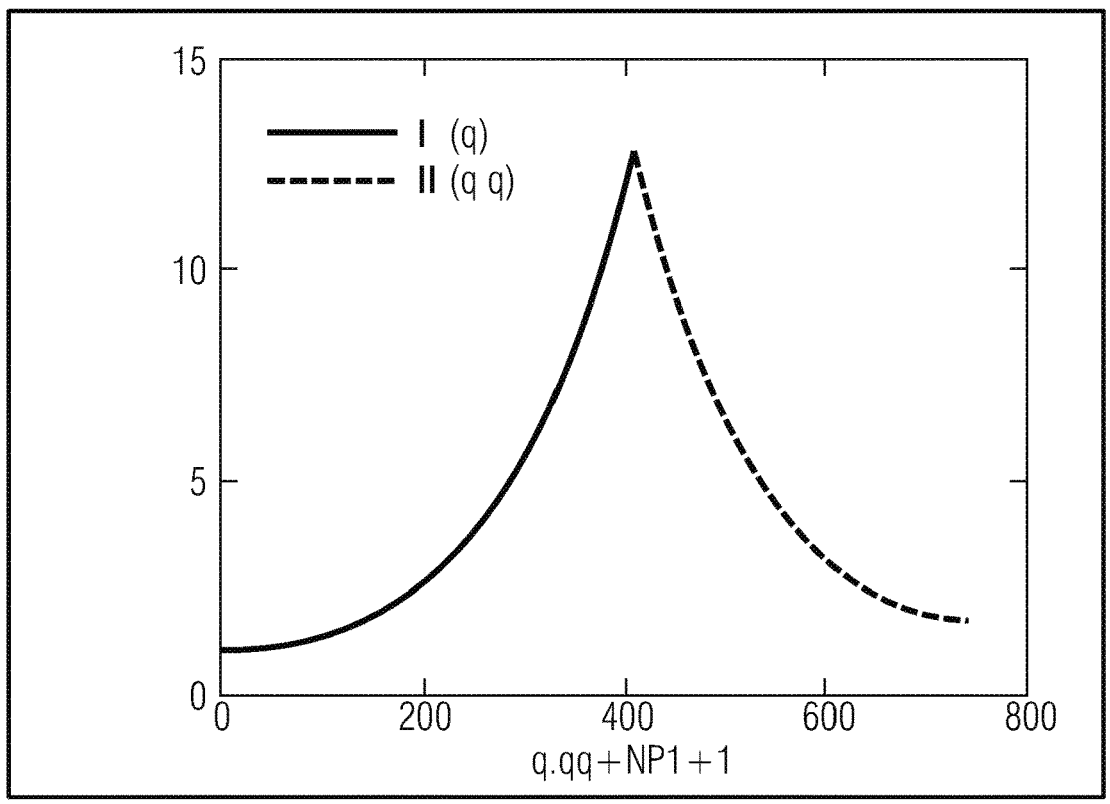
FIG. 3a shows an intensity distribution along the DFB laser normalized to 1 on the AR front facet (left) in a DFB laser with AR/HR coating and a $\lambda/4$ phase jump.
Figure 3B:
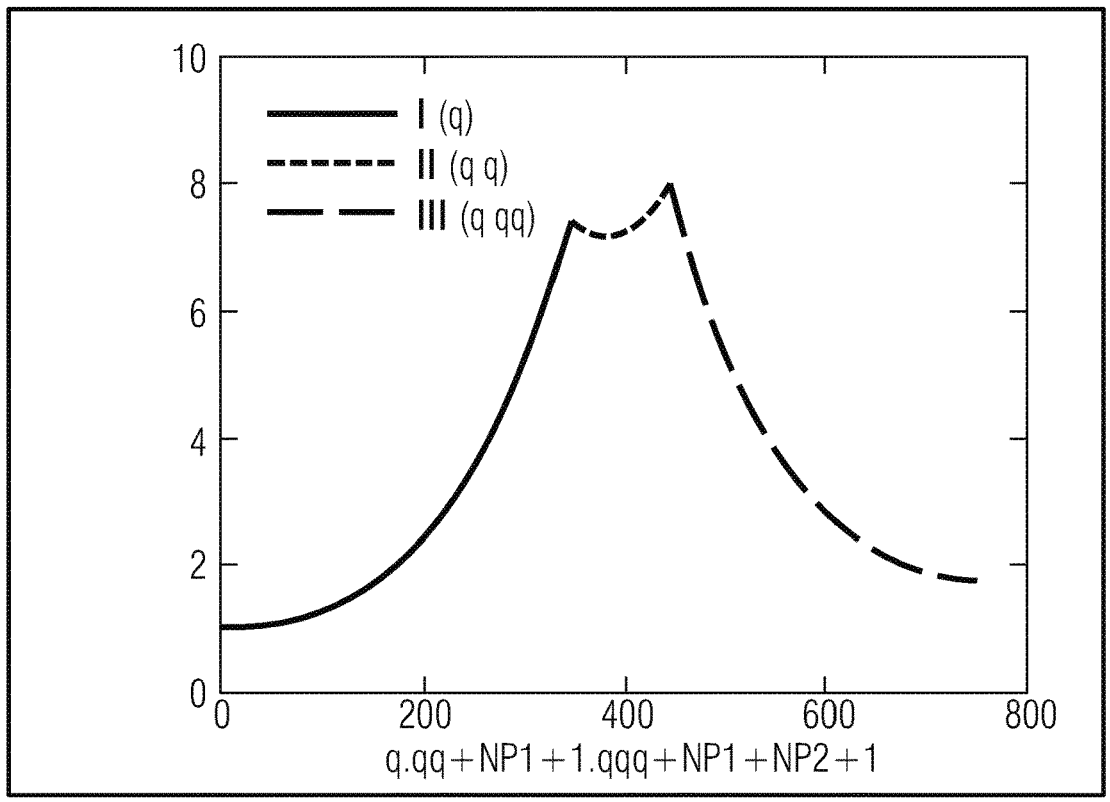
FIG. 3b shows an intensity distribution along the DFB laser, normalized to 1 on the AR front facet (left) in a DFB laser with AR/HR coating and two $\lambda/8$ phase jumps.
Figure 3C:
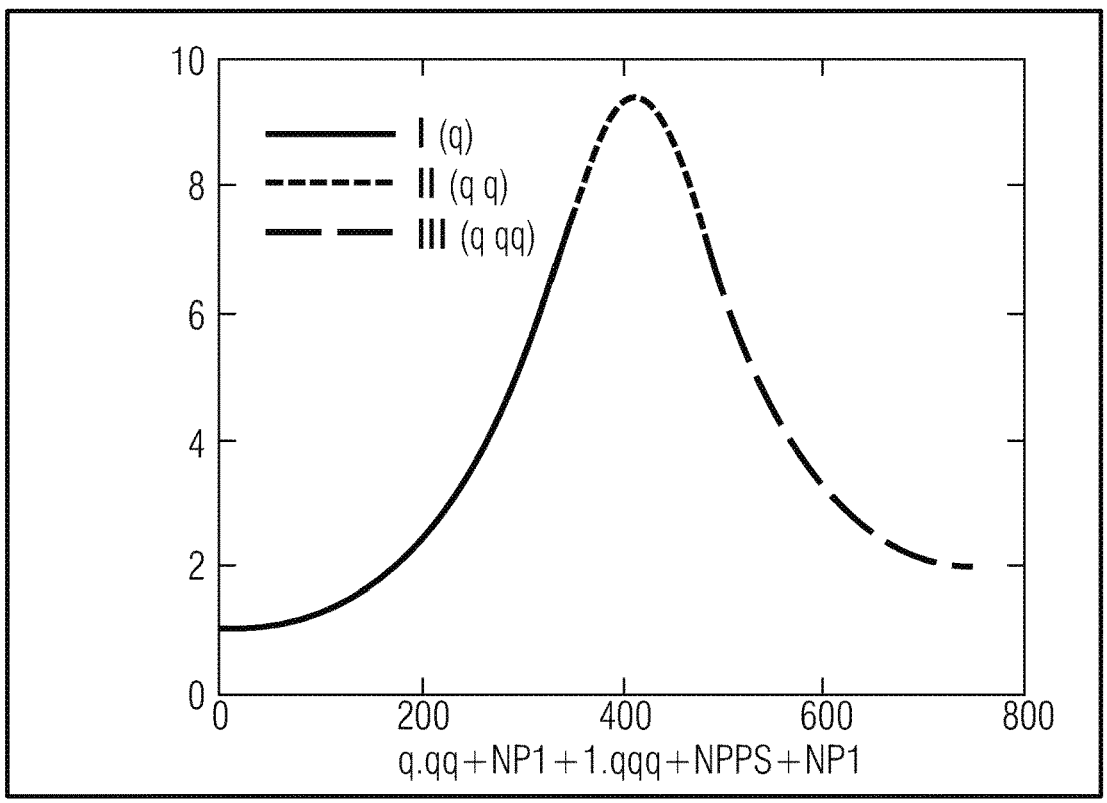
Figure 3D:
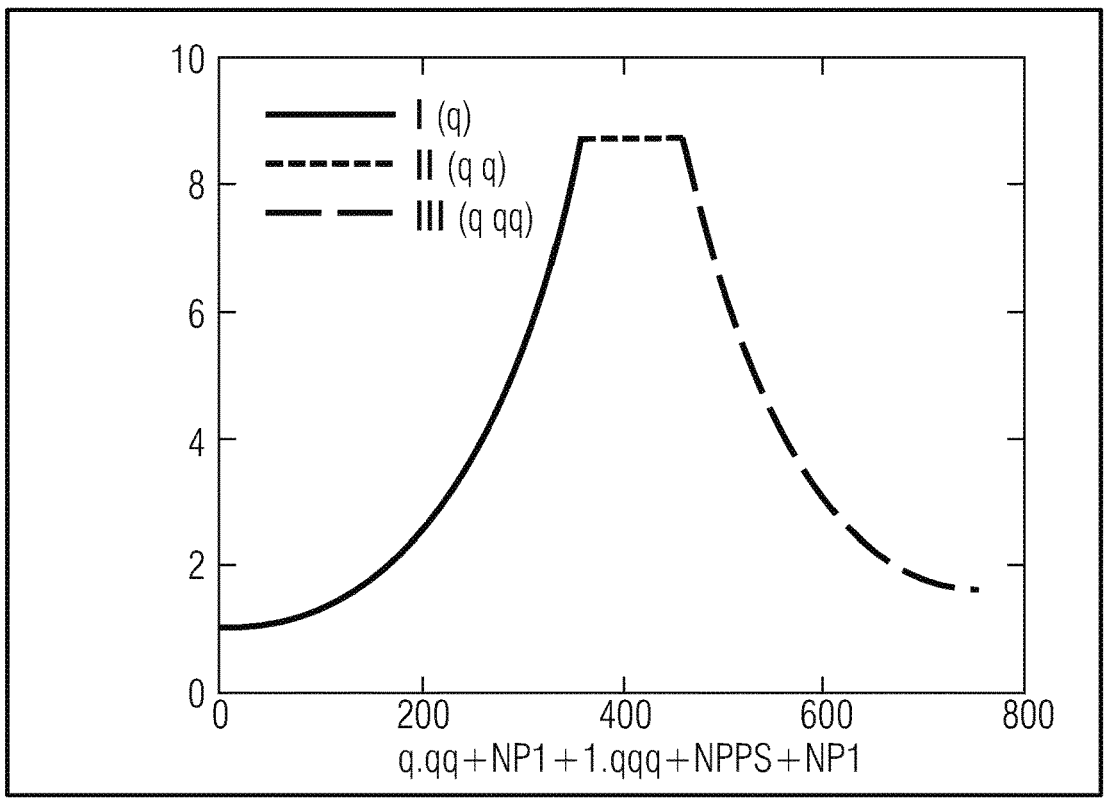

FIG. 3c shows an intensity distribution along the DFB laser normalized to 1 on the AR front facet (left) in a DFB laser with AR/HR coating and a $\lambda/4$ chirped-pitch grating phase jump FIG. 3d shows an intensity distribution along the suggested ASLPS DFB laser, normalized to 1 on the AR front facet (left) with AR/HR coating and a large phase shift (multiple phase jump) (=suggestion of the invention)

As discussed in [1.9, 1.10], with the examined symmetrical hybrid DFB lasers with centrally arranged large phase shift range the single-mode yields of identical lasers with conventional λ/4 phase jump cannot be obtained. In this respect, the usage of such LPS areas is even advised against.

Simulation calculations concerning the single-mode yield of the AR/HR coated ASLPS DFB laser with asymmetrical large phase shift arrangement show that the same can achieve almost the same yields as Λ/4 phase jump lasers.

Below, different design characteristics for an AR/HR coated InP based asymmetric large phase shift which waveguide DFB laser will be discussed. Here, it is started from the situation that the DFB laser consists of three areas of different length, wherein only the outer two areas $12g1'$ and $12g3'$ (cf. FIG. 2) include DFB gratings with the grating period Λ.

The below discussion is made with respect to the referenced length of FIG. 2.

Length of the grating area front side: $L_f = n_1 * \Lambda$ ($n_1$ = number of periods)

Large phase shift area: $L_{lps} = (2n_2+1) * (0.5 \Lambda)$ ($n_2$ = number of periods)

Length of the grip width rear side: $L_r = n_3 * \Lambda$ ($n_3$ = number of periods)

Total length of the laser: $L = L_f + L_{lps} + L_r$

Further, the following boundary conditions apply:

$n_2 \geq 1$ $L_{lps} < L/2$ $L_r < L/2$ $L_f > L_r$

According to another alternative, the grating layer may comprise five grating portions having a length of $L_f$, $L_{LPS1}$, $L_c$, $L_{LPS2}$, and $L_r$, wherein the length of two portions $L_{LPS1}$ and $L_{LPS2}$ without grating structure are defined by $L_{LPS1} = L_{LPS2} = (4*n_2+1)*(0.25*\Lambda)$ and $n_2 \geq 1$, corresponding to multiple λ/8 phase shifts. Consequently, the total length of the longitudinal extension of the grating layer then amounts to $L = L_f + L_{LPS1} + L_c + L_{LPS2} + L_r$. Here, $L_r < L_f$ so that the phase shift portions are located asymmetrically within the laser device.

According to another embodiment, the grating layer may comprise (X/2+1) portions having a length of $L_f$, $L_{LPS1}$, $L_{c1}$, $L_{LPS2}$, $L_{c2}$, $L_{LPS3}$ ..., $L_{LPS(X/4)}$, and $L_r$. The length of the (X/2+1) portions without grating are defined by $L_{LPS1} = L_{LPS2} = ... = L_{LPS(X/4)} = ((X/2)*n_2+1)*((2/X)*\Lambda)$ and $n_2 \geq 1$. The device corresponds to a multiple λ/X phase shifts. The total lengths of the longitudinal extension of the grating layer then amounts to $L = L_f + L_{LPS1} + L_{c1} L_{LPS2} + L_{c2} + L_{LPS3} ... L_{LPS(X/4)} + L_r$. Here, $L_r$ is smaller than $L_f$ so that the phase shift portions are located asymmetrically within the laser device.

The three different design characteristics have shown that the basic principle can be used for several LPS areas within an ASLPS DFB laser.

Since a layer stack has typically two lateral dimensions, it should be noted that the asymmetric arrangement should be understood as such that the phase shifting portion $12g$ is not arranged at the center, i.e. shifted to the back side $10b$, frontside $10f$ and/or into the left-right direction. Here the preferred variant is an asymmetric arrangement having the phase shifting portion $12g$ shifted into the direction to the back side $10b$ (side of a reflector) away from the front side $10f$ (side used for emitting the light).

Figure 1:
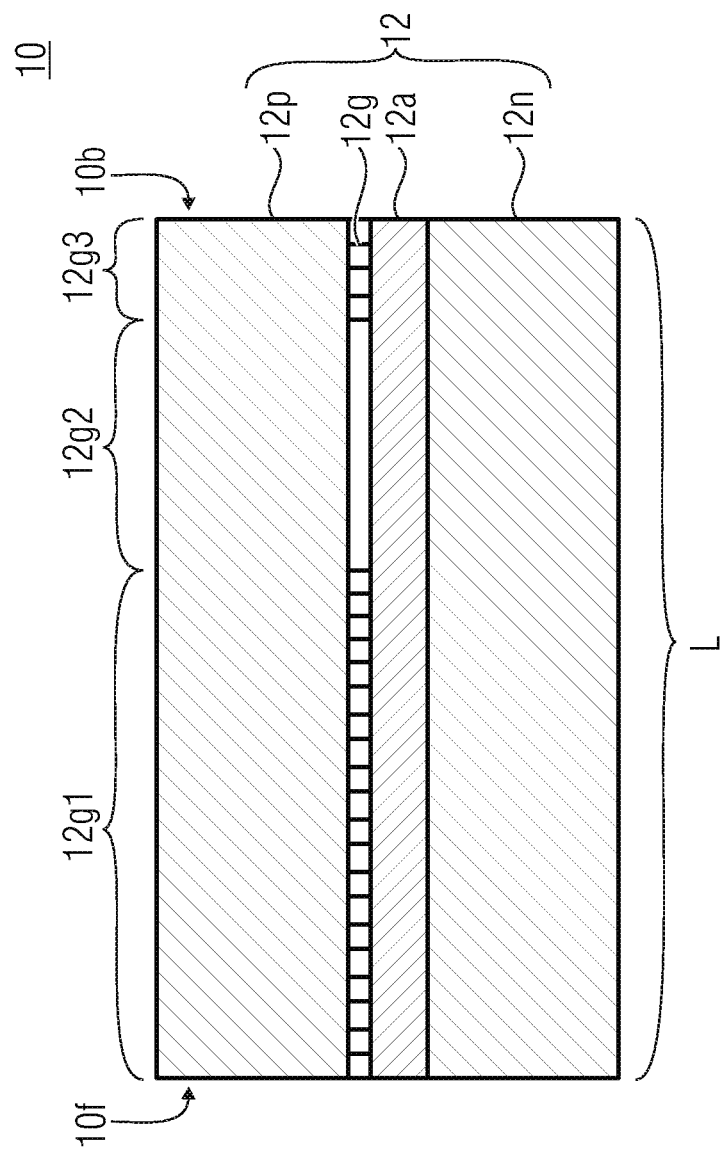
Figure 2:
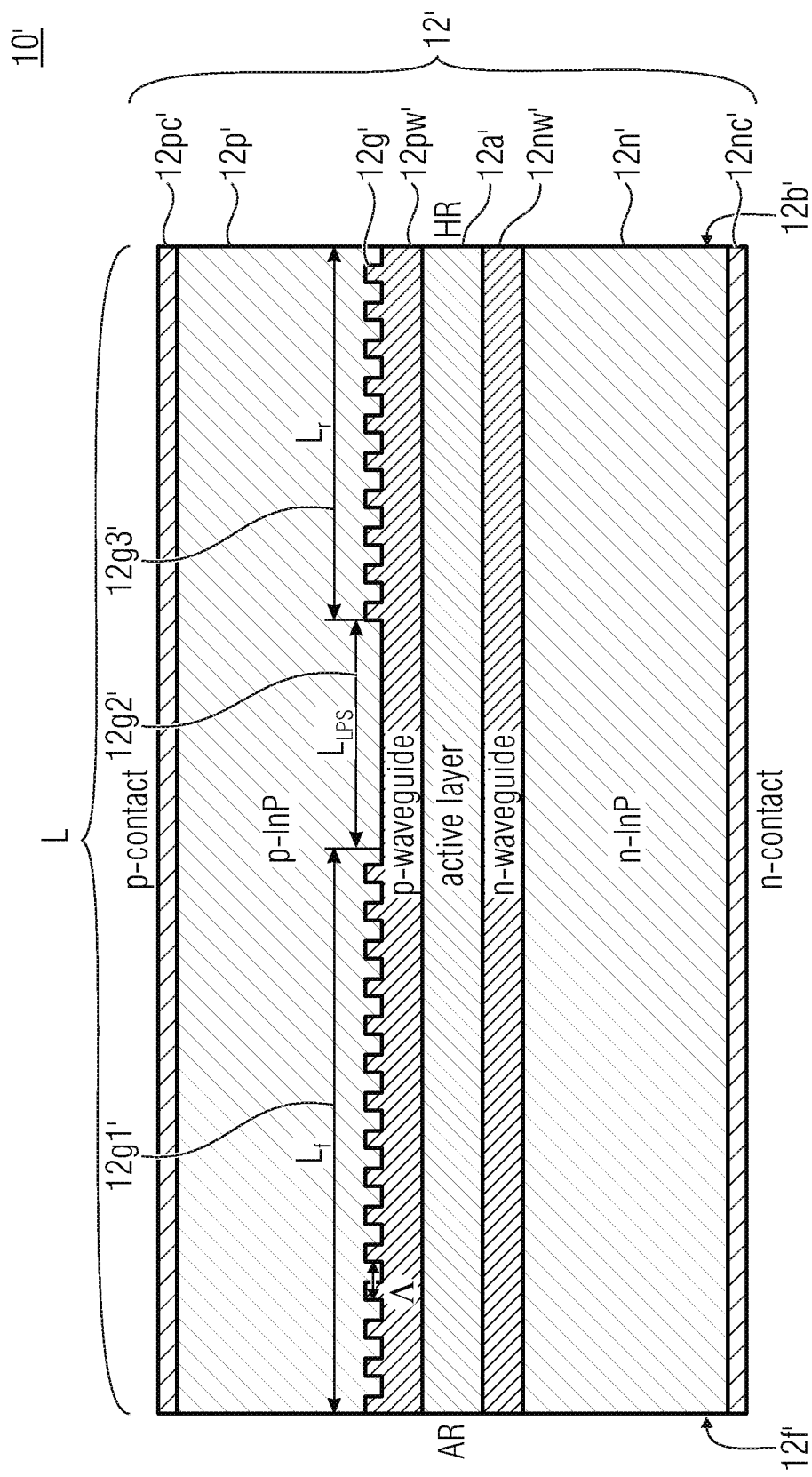

Regarding the embodiments in FIG. 1 and FIG. 2, it should be noted that the ASLPS DFB laser may comprise also a grating layer adjacent to or within the n-waveguide.

In context of FIG. 2 it should be noted that the grating layer $12g'$ may be arranged:

between the active layer $12a'$ and the wave guide $12nw'$ or
between the active layer $12a'$ and the wave guide $12pw'$
between the n-layer $12n'$ (n-InP) and the wave guide $12nw'$ or between the between the p-layer $12n'$ (p-InP) and the wave guide $12pw'$
within the n-layer $12n'$ (n-InP) or within the p-layer $12n'$ (p-InP) without direct contact to the respective wave guide $12nw'/12pw'$.

Regarding the grating, it should be noted that it is the preferred variant to use index gratings, wherein also complex-coupled gratings are possible.

Regarding the material choice, it should be mentioned that according to embodiments, the substrate may be GaAs or InP. Also other materials, like a hybrid substrate of Si or SiNx would be possible.

Although above embodiments have been discussed in context of a DFB laser, it should be noted that also other laser types, like an external cavity laser can use the above described grating layer. Additionally, a so-called buried hetero-structure laser may be used instead of a ridge waveguide laser. Regarding application, it should be mentioned that the laser may be formed as monolithic integration within photon-integrated circuits or may be an integration within an optical amplifier or may be integrated with electro-absorption modulators or Mach-Zehnder modulators.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

REFERENCES

[1.1] H. Venghaus, N. Grote, "Fibre Optic Communication", 2nd Edition Springer Verlag Heidelberg 2017, ", page 151ff

[1.2] U.S. Pat. No. 4,794,618, 1988

[1.3] U.S. Pat. No. 5,185,759, 1993

[1.4] U.S. Pat. No. 6,826,203 B1, 2004

[1.5] J. Carroll, J. Whiteaway, D. Plumb, "Distributed Feedback Semiconductor Lasers", publisher: The Institutions of Electrical Engineers 1998, London, page 145ff

[1.6] M. Okai, N. Chinone, H. Taira, T. Harada, "Corrugation-Pitch-Modulated Phase-shifted DFB Laser", IEEE Photon. Techn. Letters, vol. 1, No. 8, 1989, pp 200

[1.7] US Patent 2014/0211823 A1, 2014

[1.8] U.S. Pat. No. 5,272,714, 1993

[1.9] S. Srinivasan, A. W. Fang, D. Liang, J. Peters, B. Kaye, J. E. Bowers, "Design of phase-shifted hybrid silicon distributed feedback lasers", Optics Express 9255, vol. 19, No. 10, 2011

[1.10] C. Zhang; S. Srinivasan, Y. Tang, M. J. R. Heck, M. L. Davenport, J. E. Bowers, "Low threshold and high speed short cavity distributed feedback hybrid silicon lasers", Optics Express 10202, vol. 22, No. 9, 2014

The invention claimed is:

1. A Single Upper Electrode Distributed Feedback Laser device (10, 10'), comprising:
a layer stack (12, 12') having:
a p-layer (12p, 12p'), n-layer (12n, 12n'), which are arranged so as to form a junction having an active layer (12a') in between;
wherein, within the layer stack (12, 12') an index coupled grating layer or a grating layer is arranged, which comprises a first grating portion, a second portion and a third grating portion (12g3, 12g3'), the first grating portion, the second portion and the third grating portions (12g, 12g1', 12g2, 12g2' 12g3, 12g3') are asymmetrically arranged along a lateral dimension of the layer stack (12, 12');
wherein the second portion (12g2, 12g2') is formed without a grating structure; wherein the second portion (12g2, 12g2') has a lateral extension defined by $L_{lps}=(2*n_2+1)*0.5*\Lambda$, corresponding to multiple $\Lambda/4$ shifts, wherein $\Lambda$ is the grating period and $n_2>=1$.

2. The Single Upper Electrode Distributed Feedback Laser device (10, 10') according to claim 1, wherein the laser (10, 10') device comprises at the front side (12f, 12f') an AR-coating extending substantially perpendicular to the layers of the layer stack (12, 12') and/or at the back side (12b, 12b') an HR-coating ending substantially perpendicular to the layers of the layer stack (12, 12').

3. The Single Upper Electrode Distributed Feedback Laser device (10, 10') according to claim 1, wherein the first grating portion (12g1, 12g1') has larger lateral extension than the third grating portion (12g3, 12g3').

4. The Single Upper Electrode Distributed Feedback Laser device (10, 10') according to claim 3, wherein the lateral extension of the first grating portion (12g1, 12g1') is defined by $L_f=n_1*\Lambda$, wherein m is the number of periods, $\Lambda$ is the grating period and wherein the lateral extension of the third grating portion (12g3, 12g3') is defined by $L_r=n_3*\Lambda$, wherein n3 is the number of periods, and wherein $n_1$ and $n_3$ are selected so that $L_r<L_f$.

5. The Single Upper Electrode Distributed Feedback Laser device (10, 10') according to claim 4, wherein the total lateral extension of the lateral extension of the index coupled grating layer or the grating layer amounts to $L=L_f+L_{lps}+L_r$.

6. The Single Upper Electrode Distributed Feedback Laser device (10, 10') according to claim 1, wherein the first grating portion (12g1, 12g1') is arranged facing to front side (12f, 12f') of the Laser device (10, 10'), wherein the third grating portion (12g3, 12g3') is arranged at a back side (12b, 12b') of the Laser device (10, 10').

7. The Single Upper Electrode Distributed Feedback Laser device (10, 10') according to claim 2, wherein the HR coating at the back side (12b, 12b') is replaced by a reflective element or a DBR grating.

8. The Single Upper Electrode Distributed Feedback Laser device (10, 10') according to claim 1, wherein the p-layer (12p, 12p') comprises a waveguide (12pw', 12nw') arranged adjacent to the active layer (12a') so as to form a p-waveguide layer and/or wherein the n-layer (12n, 12n') comprises a waveguide (12pw', 12nw') arranged adjacent to the active layer (12a') so as to form a n-waveguide layer.

9. The Single Upper Electrode Distributed Feedback Laser device (10, 10') according to claim 8, wherein the index coupled grating layer or the grating layer is arranged within the p-waveguide layer or adjacent to the p-waveguide layer; and/or
wherein the index coupled grating layer or the grating layer is arranged within the n-waveguide layer or adjacent to the n-waveguide layer.

10. The Single Upper Electrode Distributed Feedback Laser device (10, 10') according to claim 1, wherein the index coupled grating layer or the grating layer comprises five portions with lateral extension $L_f$, $Li_{lps1}$, $L_c$, $L_{lps2}$, and $L_r$, where the lateral extension of the two portions without grating are defined by $L_{lps1}=L_{lps2}=(4*n_2+1)*0.25*\Lambda$ and $n_2>=1$ so as to form multiple $\lambda/8$ phase shifts.

11. The Single Upper Electrode Distributed Feedback Laser device (10, 10') according to claim 10, wherein the total lateral extension of the index coupled grating layer or the grating layer amounts to $L=L_f+L_{lps1}+L_c+Ll_{ps2}+L_r$, where $L_r<L_f$ so that the phase shift portions are located asymmetrically within the Laser device (10, 10').

12. The Single Upper Electrode Distributed Feedback Laser device (10, 10') according to claim 1, wherein the index coupled grating layer or grating ayer comprises (x/2+1) portions with lateral extension $L_f$, $L_{lps1}$, $L_{c1}L_{lps2}$, $L_{c2}$, $L_{lps3}$ ... $L_{lps(x/4)}$ and $L_r$, where the lateral extension of the (x/2+1) portions without grating are defined by $L_{lps1}=L_{lps2}=...=L_{lps(x/4)}=((x/2)*n_2+1)*2/x)*\Lambda$ and $n_2>=1$, corresponding to multiple $\lambda/x$ phase shifts.

13. The Single Upper Electrode Distributed Feedback Laser device (10, 10') according to claim 1, wherein the Laser device (10, 10') is realized on a substrate comprising InP or GaAs or on a hybrid substrate comprising Si or SiNx.

14. The Single Upper Electrode Distributed Feedback Laser device (10, 10') according to claim 1 forming an external cavity laser.

15. The Single Upper Electrode Distributed Feedback Laser device (10, 10') according to claim 1, wherein the grating layer comprises a complex coupled gratings.

16. The Single Upper Electrode Distributed Feedback Laser device (10, 10') according to claim 1 monolithically integrated with a phontonic integrated circuit.

17. The Single Upper Electrode Distributed Feedback Laser device (10, 10') according to claim 1 having etched facets or cleaved facets at a front side (12f, 12f) or at a back side (12b, 12b').

18. A Single Upper Electrode Distributed Feedback Laser device (10, 10'), comprising:
a layer stack (12, 12') having:
a p-layer (12p, 12p'), n-layer (12n, 12n'), which are arranged so as to form a pn-junction having an active layer (12a') in between;
wherein, within the layer stack (12, 12') an index coupled grating layer or a grating layer is arranged, which comprises a first, a second and a third grating portion (12g3, 12g3'), the first, the second and the third grating portions (12g, 12g1', 12g2, 12g2' 12g3, 12g3') are asymmetrically arranged along a lateral dimension of the layer stack (12, 12');
wherein the second grating portion (12g2, 12g2') is formed without a grating structure; and
wherein the index coupled grating layer or the grating layer comprises five portions with lateral extension $L_f$, $L_{lps1}$, $L_c$, $L_{lps2}$, and $L_r$, where the lateral extension of the two portions without grating are defined by $L_{lps1}=L_{lps2}=(4*n_2+1)*0.25*\Lambda$ and $n_2>=1$ so as to form multiple $\lambda/8$ phase shifts.

19. The Single Upper Electrode Distributed Feedback Laser device according to claim 1, having an electrode extending along at least two portions of the first grating portion, the second portion and the third grating portion; or having two opposing electrodes extending along at least two portions of the first grating portion, the second portion and the third grating portion.

20. The Single Upper Electrode Distributed Feedback Laser device according to claim 1, having an electrode extending along the first grating portion, the second portion and the third grating portion, or having two opposing electrodes extending along the first grating portion, the second portion and the third grating portion.

21. The Single Upper Electrode Distributed Feedback Laser device according to claim 1, having an electrode extending along the entire index coupled grating layer or the entire grating layer; or having two opposing electrodes extending along extending along the entire index coupled grating layer or the entire grating layer.

22. The Single Upper Electrode Distributed Feedback Laser device according to claim 1, wherein Distributed Feedback Laser device has just one light emitting section within the active layer, wherein the light emitted by the light emitting section interacts with the entire index coupled grating layer or the entire grating layer.

* * * * *

UNITED STATES PATENT AND TRADEMARK OFFICE
CERTIFICATE OF CORRECTION

PATENT NO. : 10,680,409 B2
APPLICATION NO. : 15/914864
DATED : June 9, 2020
INVENTOR(S) : Martin Moehrle Page 1 of 1

It is certified that error appears in the above-identified patent and that said Letters Patent is hereby corrected as shown below:

In the Claims

Claim 10, Column 8, Line 10:
Please change: "...with lateral extension $L_f$, $Li_{LPS1}$, $L_C$, $L_{LPS2}$, and..."
To read: --...with lateral extension $L_f$, $L_{LPS1}$, $L_C$, $L_{LPS2}$, and...--

Signed and Sealed this
Twenty-second Day of December, 2020

Andrei Iancu
*Director of the United States Patent and Trademark Office*